US012593675B2

(12) United States Patent
Maheshwari et al.

(10) Patent No.: US 12,593,675 B2
(45) Date of Patent: Mar. 31, 2026

(54) RETICLE STITCHING TO ACHIEVE HIGH-CAPACITY INTEGRATED CIRCUIT

(71) Applicant: Intel Corporation, Santa Clara, CA (US)

(72) Inventors: Atul Maheshwari, Portland, OR (US); Ankireddy Nalamalpu, Portland, OR (US); Mahesh K. Kumashikar, Bangalore (IN); David Parkhouse, Hillsboro, OR (US)

(73) Assignee: Altera Corporation, San Jose, CA (US)

( * ) Notice: Subject to any disclaimer, the term of this patent is extended or adjusted under 35 U.S.C. 154(b) by 868 days.

(21) Appl. No.: 17/559,645

(22) Filed: Dec. 22, 2021

(65) Prior Publication Data

US 2022/0115315 A1      Apr. 14, 2022

(51) Int. Cl.
*H01L 23/528*      (2006.01)
*H01L 21/768*      (2006.01)

(52) U.S. Cl.
CPC .......... *H01L 23/528* (2013.01); *H01L 21/768* (2013.01)

(58) Field of Classification Search
CPC ... H01L 23/528; H01L 21/768; H01L 23/522; H01L 21/76838; H10D 84/907; G03F 1/00; G03F 7/70475
See application file for complete search history.

(56) References Cited

U.S. PATENT DOCUMENTS

2011/0228464 A1*  9/2011  Guzek ................. H01L 23/5389
                                                        257/E21.598
2013/0320565 A1*  12/2013  Griswold .............. H01L 23/147
                                                        257/777

* cited by examiner

*Primary Examiner* — Patricia D Valenzuela
(74) *Attorney, Agent, or Firm* — Fletcher Yoder, P.C.

(57) ABSTRACT

A reticle-stitched integrated circuit is provided. The reticle-stitched integrated circuit extends over a first die area and a second die area of an integrated circuit wafer. While individually the first die area and the second die area are within their respective reticle limits, collectively the first die area and the second die area exceed the reticle limit. A first layer of the reticle-stitched integrated circuit may have communication wires that remain exclusively in only one of the first die area and the second die area. A second layer of the reticle-stitched integrated circuit may have communication wires that overlap the first die area and the second die area, thereby allowing communication between the two die areas and enabling the reticle-stitched integrated circuit to exceed the limit of the reticle.

19 Claims, 9 Drawing Sheets

EXAMPLE LOGICAL ARRANGEMENT
OF SECTOR (COMBINATION OF
FABRIC DIED AND BASE DIE)

POWER
SUPPLY

RETICLE STITCHING TO ACHIEVE HIGH-CAPACITY INTEGRATED CIRCUIT

BACKGROUND

The present disclosure relates generally to integrated circuit devices, such as programmable logic devices. More particularly, the present disclosure relates to reticle stitching to achieve high-capacity integrated circuits such as high-capacity field programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits devices are found in numerous electronic devices, from handheld devices, computers, gaming systems, robotic devices, automobiles, and more. These integrated circuit devices are often constructed by assembling multiple dies on a package and connected by an interposer for signal transfer. However, the use of an interposer limits bandwidth and increases latency of off-die communication on the package. Additionally, the size of the die is generally constrained by the maximum patterning size of a lithography system. That is, any single pattern or mask used on the silicon wafer to create a die cannot exceed a maximum patterning size, referred to as a reticle limit, of the lithography system. Indeed, multiple dies on the package are connected via the interposer for die-to-die communication, which may sometimes be slower than intra-die communication.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
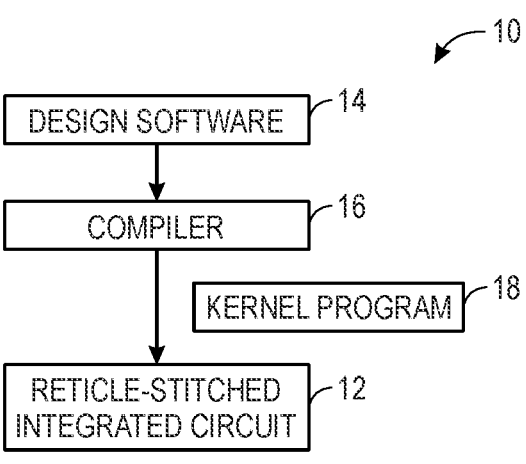
FIG. 1 is a block diagram of a process for implementing a system design on a reticle-stitched integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to reticle stitching to achieve high-capacity integrated circuits, such as high-capacity field programmable gate arrays (FPGAs). In particular, the embodiments described herein are directed to creating a reticle-stitched integrated circuit beyond a single reticle limit by reticle stitching. That is, the reticle-stitched integrated circuit may include a first die area within a reticle limit and a second die area within a reticle limit. In an embodiment, the reticle-stitched integrated circuit may include a first set of layers with some communication wires, also sometimes referred to generally as "interconnects," located within a first die area and a second die area. The reticle-stitched integrated circuit may include a second set of layers with some communication wires located within a first die area and a second die area, where at least some communication wires overlap. That is, at least one of the second set of layers may include an overlap between the first die area and the second die area to create a boundary area for at least some of the communication wires to overlap. As such, the reticle-stitched integrated circuit may overcome the reticle limit by transferring a signal through the boundary area rather than through an interposer. The reticle-stitched integrated circuit may have properties similar to a monolithic die rather than two dies connected through the interposer, such as improved bandwidth, low latency, improved performance, and the like.

With the foregoing in mind, the reticle-stitched integrated circuit may be patterned such that a first layer of the first set of layers and a second layer of the second set of layers may be different. That is, the first layer or first set of layers may include a first set of patterns where a first die area and a second die area do not overlap. For example, the first layer or first set of layers may be patterned with a first set of masks of uniform die areas, in which the die size may be equal to or less than the reticle limit. The dies of the first layer or first set of layers may have some communication wires that remain within the die areas. The second layer or second set of layers may include a second set of patterns where the first die area and the second die area may have at least some overlap. For example, the first layer of the second set of layers may be patterned with a second set of masks, in which the first die area and the second die area overlap to form a boundary area between the two die areas. In some examples, the first layer may include a sacrificial area along at least one edge of the edge used to create the boundary area between the first die area and the second die area. The first die area and the second die area of the second layer or second set of layers may have some communication wires within the die area and within the boundary area. To this end, the communication wires of the first layer or first set of layers may be a shorter length than at least some of the communication wires of the second layer or second set of layers.

The boundary area between two die areas in a reticle-stitched integrated circuit may allow for at least some communication wires to overlap and directly transfer a signal from the first die area to the second die area of the second layer or second set of layers. For example, a communication wire may extend from an edge of the first die area to the boundary area between the first die area and the second die area. Additionally or alternatively, a second communication wire may extend from the boundary area to an edge of the second die area. As such, the communication wires may connect directly between the first die area and the second die area of the second layer or second set of layers through the boundary layer. As such, the reticle-stitched integrated circuit may include first layer with the first set of patters where the first die area and second die area may not overlap and the second layer or second set of layers with the second set of patterns where the first die area and the second die area may have at least some overlap, thereby allowing the second layer or second set of layers to directly transfer a signal through the overlapping area.

With that in mind, the second set of layers may have coarser-grained pattern than the first set of layers. For example, the first layer of the second set layers may be a Metal 9 layer that is coarser-grained than the first set of layers. Indeed, the first layer of the first set of layers may have a fine-grained architecture, which includes an array of homogeneous reconfigurable programmable processing elements. In another example, the first layer of the second set of layers may have a coarse-grained architecture, which includes an array of heterogeneous reconfigurable programming processing elements.

With that in mind, the reticle-stitched die may be created with one or more interconnection resources on one or more edges of the reticle-stitched die for off-die communication. That is, the first set of masks and the second set of masks may be designed to pattern one or more interconnection resources on one or more edges of the first and second die areas. Interconnection resources may be used to route signals for off-die communication. In an example, the interconnection resources may include one or more communication ports (e.g., AXI, UIB, MB), one or more input/output (BIO) ports, the boundary layer (e.g., AIB, AIBP), one or more decoupling capacitors (DECAPs). Hardened circuits such as processors (e.g., an x86 processor, an ARM processor, a secure device manager (SDM)) may also be patterned on the periphery of the first and second die areas. In an embodiment, the first set of patterns of the first layer or first set of layers may include interconnection resources on all four edges of the first and second die areas. At the boundaries between two die areas within a reticle-stitched integrated circuit, areas in the first layer or set of layers that are patterned for inter-die interconnection resources may be referred to as "sacrificial areas." This is because the second layer or set of layers around the boundaries between two die areas does not include the rest of the circuitry to complete the inter-die resources, since the second layer or set of layers instead has a pattern that allows for direct communication between two die areas within the reticle-stitched integrated circuit. Thus, the first layer or set of layers may be the same for both the first die area and the second die area. By contrast, the second layer or set of layers may differ in the first die area from the second die area. The outer edges of the reticle-stitched integrated circuit may be patterned to have interconnection resources in both the first layer or set of layers and the second layer or set of layers, allowing interconnections resources to be found on all four edges of the overall die and allow for off-die communication.

A reticle-stitched integrated circuit may stitch together any suitable number of die areas, each of which may fall within its own reticle limit—allowing the overall reticle-stitched die to exceed one reticle limit, two reticle limits, three reticle limits, four reticle limits, or more. Some reticle-stitched integrated circuits may have a first die area in a first reticle limit, a second die area in a second reticle limit, and a third die area in a third reticle limit, and two boundary areas between different sets of two of the die areas. Some may have a first die area in a first reticle limit, a second die area in a second reticle limit, a third die area in a third reticle limit, a fourth die area in a fourth reticle limit, and four boundary areas between different sets of two of the die areas. In this way, the reticle-stitched integrated circuit may have any suitable geometry of integrated circuit die areas that are connected to one another in at least one layer that overlaps a boundary between two adjacent die areas. These adjacent die areas would, individually, fall within a single reticle limit, but the entirety of the reticle-stitched integrated circuit may collectively exceed the reticle limit.

An integrated circuit according to this disclosure may take any suitable form. One example is that of a programmable logic device that includes programmable logic circuitry (e.g., programmable logic fabric, FPGA). FIG. 1 illustrates a block diagram of a system 10 used to design and/or configure an integrated circuit device (e.g., a programmable logic device, an application specific integrated circuit (ASIC)). A designer may implement functionality on an integrated circuit, such as a reticle-stitched integrated circuit 12 that includes some reconfigurable circuitry, such as an FPGA. A designer may implement a circuit design to be programmed onto the reticle-stitched integrated circuit 12 using design software 14, such as a version of QUARTUS® by INTEL CORPORATION. The design software 14 may use a compiler 16 to generate a low-level circuit-design, which may be provided as a kernel program 18, sometimes known as a program object file or bitstream that programs the reticle-stitched integrated circuit 12. That is, the compiler 16 may provide machine-readable instructions representative of the circuit design to the reticle-stitched integrated circuit 12.

Figure 2:
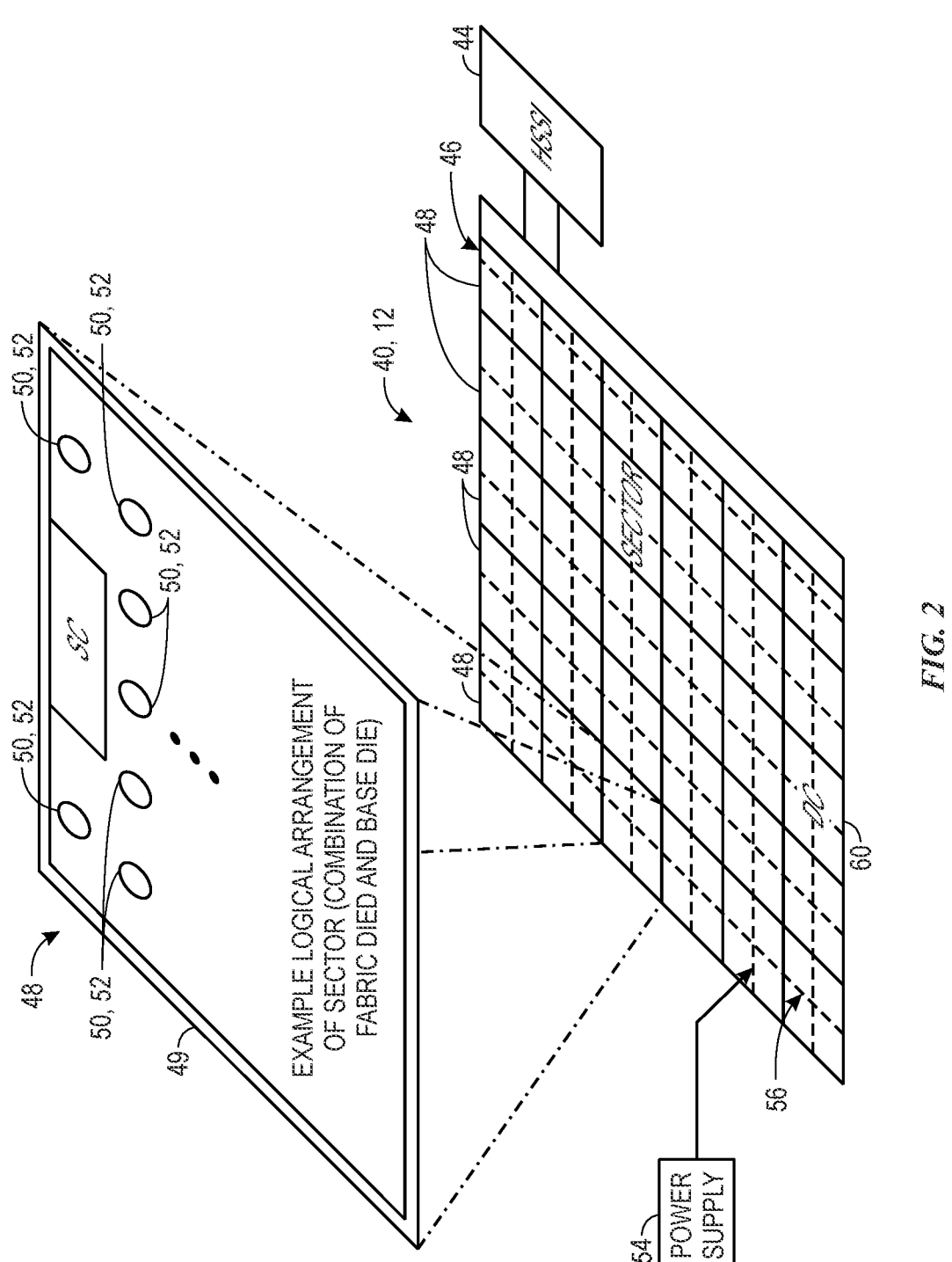
FIG. 2 is a block diagram of an example logical arrangement of the integrated circuit device in the form of a field programmable gate array (FPGA), in accordance with an embodiment of the present disclosure.

The reticle-stitched integrated circuit 12 may include any programmable logic device, such as a field programmable array (FPGA) 40, as shown in FIG. 2. For the purposes of this example, the FPGA 40 is referred to as a FPGA, though the device may be any suitable type of programmable logic device (e.g., an application-specific integrated circuit and/or application-specific standard product). The FPGA 40 may be formed on a single plane. Additionally or alternatively, the FPGA 40 may be a three-dimensional FPGA having a base die and a fabric die. The FPGA 40 may be formed across multiple die areas that individually fall within respective reticle limits, even while the FPGA 40 as a whole may exceed one reticle limit, two reticle limits, three reticle limits, four reticle limits, or more.

In the example of FIG. 2, the FPGA 40 may include transceiver 44 that may include and/or use input-output circuitry for driving signals off the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 1, 5, 10, 50, 100, 500, 1000, 5000, 10,000, 50,000, or 100,000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 may be augmented with numerous additional capabilities. For example, such capabilities may include locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins and input/output circuitry. In one example, the configuration memory 52 may be implemented as configuration random-access-memory (CRAM) cells. As discussed below, in some embodiments, the configuration data may be loaded into the FPGA 40 using an update to microcode of the processor in which the FPGA 40 is embedded. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50, or programmable components of the interconnection resources 46.

The programmable elements 50 of the FPGA 40 may also include some communication wires to transfer a signal. In an embodiment, the programmable logic sectors 48 may be provided in the form of vertical routing channels (e.g., interconnects formed along a y-axis of the FPGA 40) and horizontal routing channels (e.g., interconnects formed along an x-axis of the FPGA 40), and each routing channel may include at least one track to route at least one communication wire. If desired, communication wires may be shorter than the entire length of the routing channel. That is, the communication wire may be shorter than the first die area or the second die area. A length L wire may span L routing channels. As such, length four wires in a horizontal routing channel may be referred to as "H4" wires, whereas length four wires in a vertical routing channel may be referred to as "V4" wires.

Figure 3:
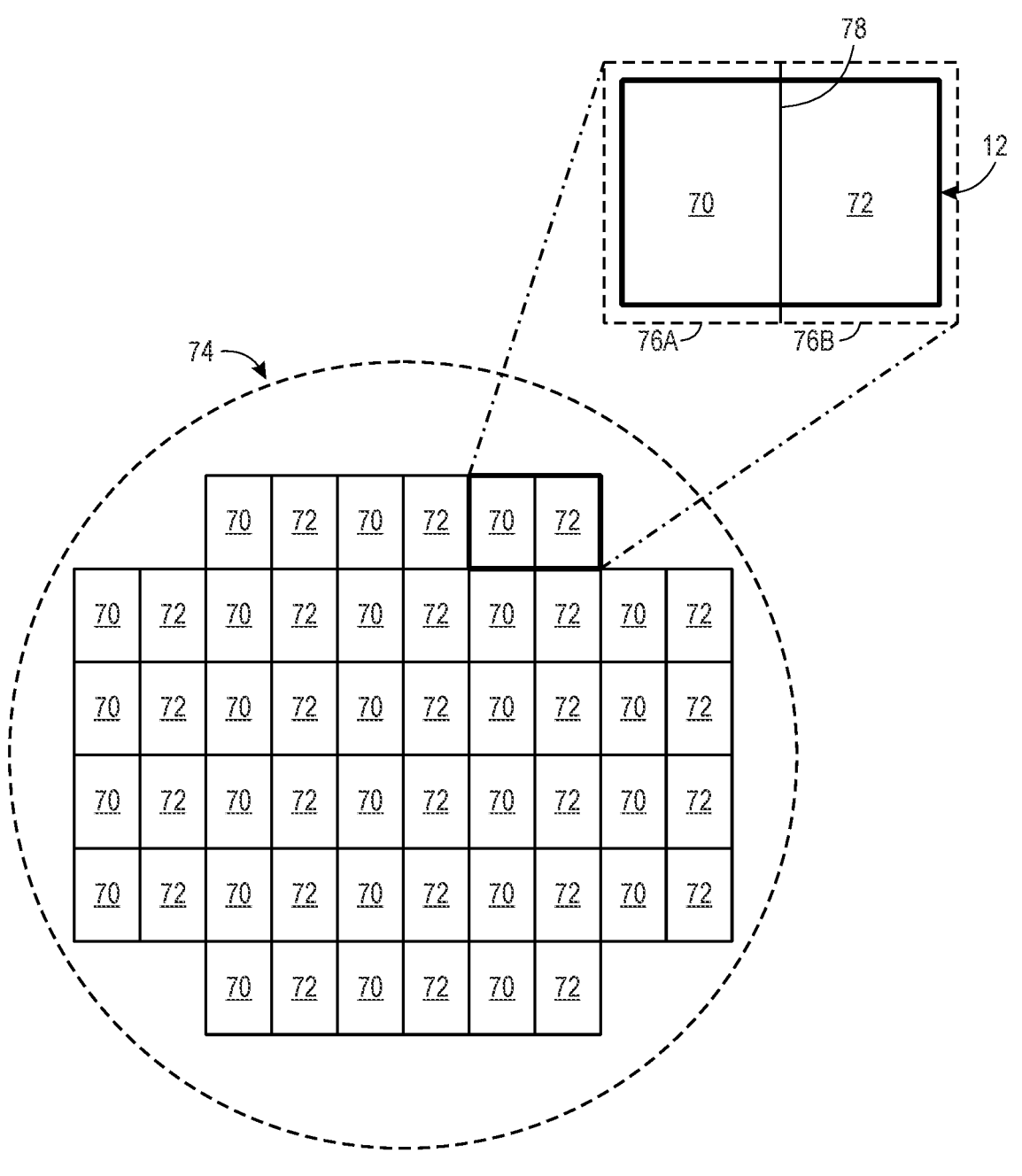
FIG. 3 is a schematic diagram of a silicon wafer on which a reticle-stitched integrated circuit is patterned, in accordance with an embodiment of the present disclosure.

The reticle-stitched integrated circuit 12 may be formed by patterning a first die area 70 and a second die area 72 on a silicon wafer 74, as shown in FIG. 3. As shown in FIG. 3, the first die area 70 and the second die area 72 are within respective reticle limits 76 of the lithography system used to pattern the reticle-stitched integrated circuit 12 on the silicon wafer 74. Here, the first die area 70 is within a first reticle limit 76A and the second die area 72 is within a second reticle limit 76B. In one example, the lithography system may be 20 nm and the reticle limit 76 of the lithography system may be approximately 26 mm×32 mm. In other embodiments, the lithography system may be 16 nm, 7 nm, 5 nm, 3 nm, or smaller. Although not explicitly shown, the reticle limits 76A and 76B may partially overlap one another around a boundary area 78.

Returning to the example of FIG. 3, a first set of layers of the respective die areas 70 and 72 may be patterned using the same first set of masks of uniform die areas. That is, the first set of layers may include a first set of patterns used for both the first die area 70 and the second die area 72. The first die area 70 and the second die area 72 may be adjacent to each other. In some examples of the reticle-stitched integrated circuit 12, the first die area 70 and the second die area 72 may be the same size, while in others, the first die area 70 and the second die area 72 may have different sizes.

A second layer or second set of layers of the die areas 70 and 72 may be patterned with a second set of masks, in which the first die area 70 and the second die area 72 may have at least some overlap at the boundary area 78. The boundary area 78 may represent an area where adjacent reticle limits 76 overlap between two die areas in a single reticle-stitched integrated circuit 12.

In other examples, the reticle-stitched integrated circuit 12 may be formed from three or more die areas. Indeed, each respective die area may be within the reticle limit 76; however, the three or more die areas may be reticle-stitched to form the reticle-stitched integrated circuit 12, which collectively may be greater than the reticle limit 76.

Figure 4:
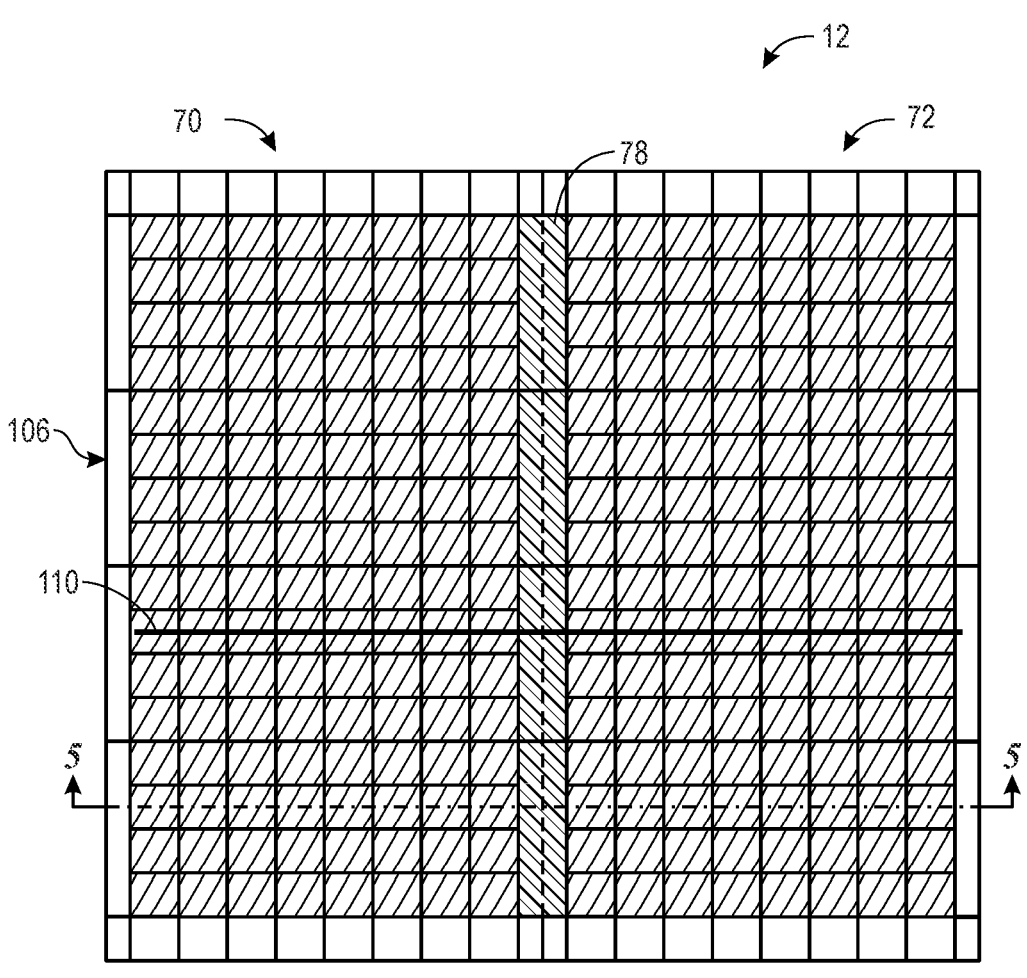
FIG. 4 is a top view of a block diagram of a reticle-stitched integrated circuit that is larger than a reticle limit, which includes two die areas each within the reticle limit, in accordance with an embodiment of the present disclosure.

With the foregoing in mind, FIG. 4 is a top view of a block diagram of the reticle-stitched integrated circuit 12 with an area larger than the reticle limit 76, which includes at least two die areas each within the reticle limit 76. In an embodiment, the reticle-stitched integrated circuit 12 may include the first die area 70, the second die area 72, and the boundary area 78. That is, the first die area 70 and the second die area 72 may be less than the reticle limit 76, but the two die areas may be reticle-stitched to form the reticle-stitched integrated circuit 12, which may be larger than the reticle limit 76.

In an embodiment, the first die area 70 may include a number of programmable logic sectors, one or more interconnection resources 106, and a sacrificial area in the boundary area 78 (e.g., on a right edge). The second die area 72 may also include a number of programmable logic sectors, one or more interconnection resources 106, and a sacrificial area in the boundary area 78 (e.g., on a left edge). The interconnection resources 106 may be on one or more edges of the first die area 70 and/or the second die area 72 and may transfer a signal for off-die communication. The boundary area 78 may be between the first die area 70 and the second die area 72. The sacrificial area may be, for example, approximately 0.0005 mm×a width of the die area or a length of the die area×0.0005, 0.001 mm×a width of the die area or a length of the die area×0.001, 0.002 mm×a width of the die area or a length of the die area×0.002, to name a few possibilities. For example, the first die area 70 and the second die area 72 may have a size of 22.001 mm×33 mm, with the boundary area 78 having an area of 0.001 mm×33 mm. In another example, the size of the first die area 70 and the second die area 72 may be 25 mm×30.001 mm, with the boundary area 78 having an area of 25 mm×0.001 mm. As such, the boundary area 78 may include both areas of the first die 70 and the second die 72. The boundary area 78 may contain some communication wires that overlap between the first die area 70 and the second die area 72. The boundary area 78 may have any suitable dimensions for some communication wires to overlap. The reticle-stitched integrated circuit 12 may transfer a signal from the first die area 70 through the boundary area 78 to the second die area 72, and vice versa.

Numerous communication wires (also sometimes referred to as interconnects) 110 of the first die area 70 and the second die area 72 may connect an edge of the first die area 70 to an edge of the second die area 72. In some cases, the communication wires 110 may overlap at the boundary area 78 to effectively extend the length of the reticle-stitched integrated circuit 12 to connect the interconnection resources 106 of the first die area 70 to the interconnection resources of the second die area 72. In other cases, the communication wires 110 may overlap at the boundary area 78 but may not fully extend the length of the reticle-stitched integrated circuit 12. The communication wires 110 are able to extend between the first die area 70 and the second die area 72 because they may be patterned to overlap at the boundary area 78, effectively creating contiguous communication wires 110 between the first die area 70 and the second die area 72.

The communication wires 110 that extend across the boundary area 78 may be formed by patterning two overlapping communication wires that respectively reside within the first die area 70 and second die area 72. These components of the communication wires 110 may be equal to or less than a size (e.g., horizontal or vertical) of the reticle-stitched integrated circuit 12. For example, in a horizontal configuration (e.g., in which the boundary area 78 of the reticle-stitched integrated circuit 12 crosses the x-axis), the communication wire class may be H4, H6, H12, or any suitable wire class that may allow connection between the first die area 70 and the second die area 72. In a vertical configuration (e.g., in which the boundary area 78 of the reticle-stitched integrated circuit 12 crosses the y-axis), the communication wire class may be V4, V6, V12, or any suitable wire class that may allow connection between the first die area 70 and the second die area 72.

Figure 5:
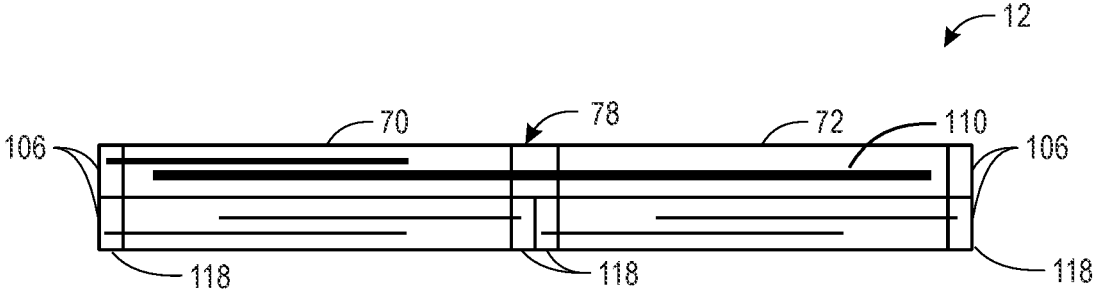
FIG. 5 is a cross-sectional view of the reticle-stitched integrated circuit of FIG. 4, in accordance with an embodiment of the present disclosure.

FIG. 5 is a cross-sectional view of the reticle-stitched integrated circuit 12 of FIG. 4 at cut lines 5-5. As seen in FIG. 5, lower layers of the reticle-stitched integrated circuit 12 tend to be more fine-grained and may not overlap. The lower layers of the reticle-stitched integrated circuit 12 may have a uniform pattern for both the first die area 70 and the second die area 72. Since the lower layers may be uniform, there may be fine-grained interconnect components 118 along the outer edges of the reticle-stitched integrated circuit 12 and around the boundary area 78. The fine-grained interconnect components 118 that are patterned along the boundary area 78 are not used for inter-die communication. As such, the fine-grained interconnect components 118 that are patterned along the boundary area 78 may be referred to as "sacrificial" circuitry or a "sacrificial" area. By contrast, upper layers of the reticle-stitched integrated circuit 12 tend to be more coarse-grained and may overlap along the boundary area 78, allowing the communication wire(s) 110 to cross between the first die area 70 and second die area 72. Because the upper layers are not uniform between the die areas 70 and 72, in the upper layers, the boundary area 78 may not include the same circuitry to complete the interconnect resources 106 as found in the outer edges of the reticle-stitched integrated circuit 12. There may be a threshold layer that distinguishes the lower layers from the upper layers. In an embodiment, the threshold layer may be a Metal 9 layer; however, the threshold layer may be any suitable metal layer chosen by a designer.

The communication wires (e.g., communication wire 110) of the upper layers connect the first die area 70 to the second die area 72 at the boundary area 78. In certain embodiments, the communication wires 110 may be classes such as H4, H6, H12, or the like. In other embodiments, the communication wires 110 may be classes such as V4, V6, V12, or the like. As such, the communication wires 110 of the second layer or second set of layers may transfer a signal from the first die area 70 to the second die area 72 through the boundary area 78 without the use of an interposer. Indeed, the first die area 70 and the second die area 72 may be reticle-stitched to overcome the reticle limit 76 and form the reticle-stitched integrated circuit 12 having many of the properties of a monolithic die with improved signal bandwidth, improved performance, or the like.

Figure 6:
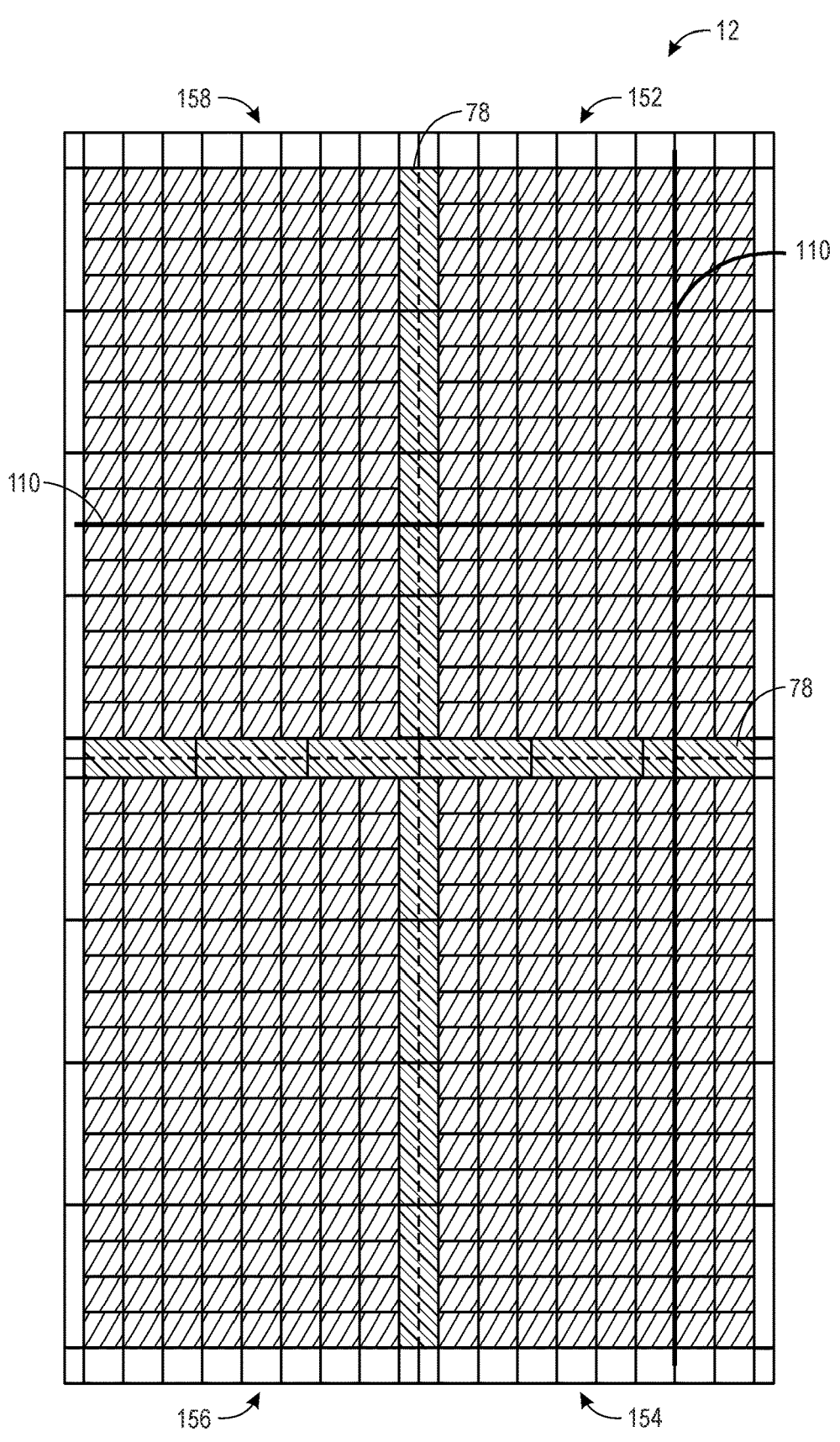
FIG. 6 is a top view of a block diagram of the reticle-stitched integrated circuit that is larger than the reticle limit, which includes four die areas each within the reticle limit, in accordance with an embodiment of the present disclosure.

Other configurations of the high-capacity integrated circuit device may include additional die areas that fall within respective reticle limits. For example, as shown in FIG. 6, the reticle-stitched integrated circuit 12 may include four die areas 152, 154, 156, and 158 that may be reticle-stitched together. The first layer or first set of layers (e.g., the lower layers) may be patterned with a second set of masks to create the first die area 152 with a sacrificial area on the bottom edge and the left edge, the second die area 154 with a sacrificial edge on the top edge and left edge, the third die area 156 with a sacrificial area on the top edge and the right edge, and the fourth die area 158 on the bottom edge and the right edge. As such, the sacrificial edges of the four die areas 152, 154, 156, and 158 may be adjacent. A second set of layers may overlap above the sacrificial areas through boundary areas 78 of the reticle-stitched integrated circuit 12 (e.g., in the manner shown in FIG. 5).

Figure 7:
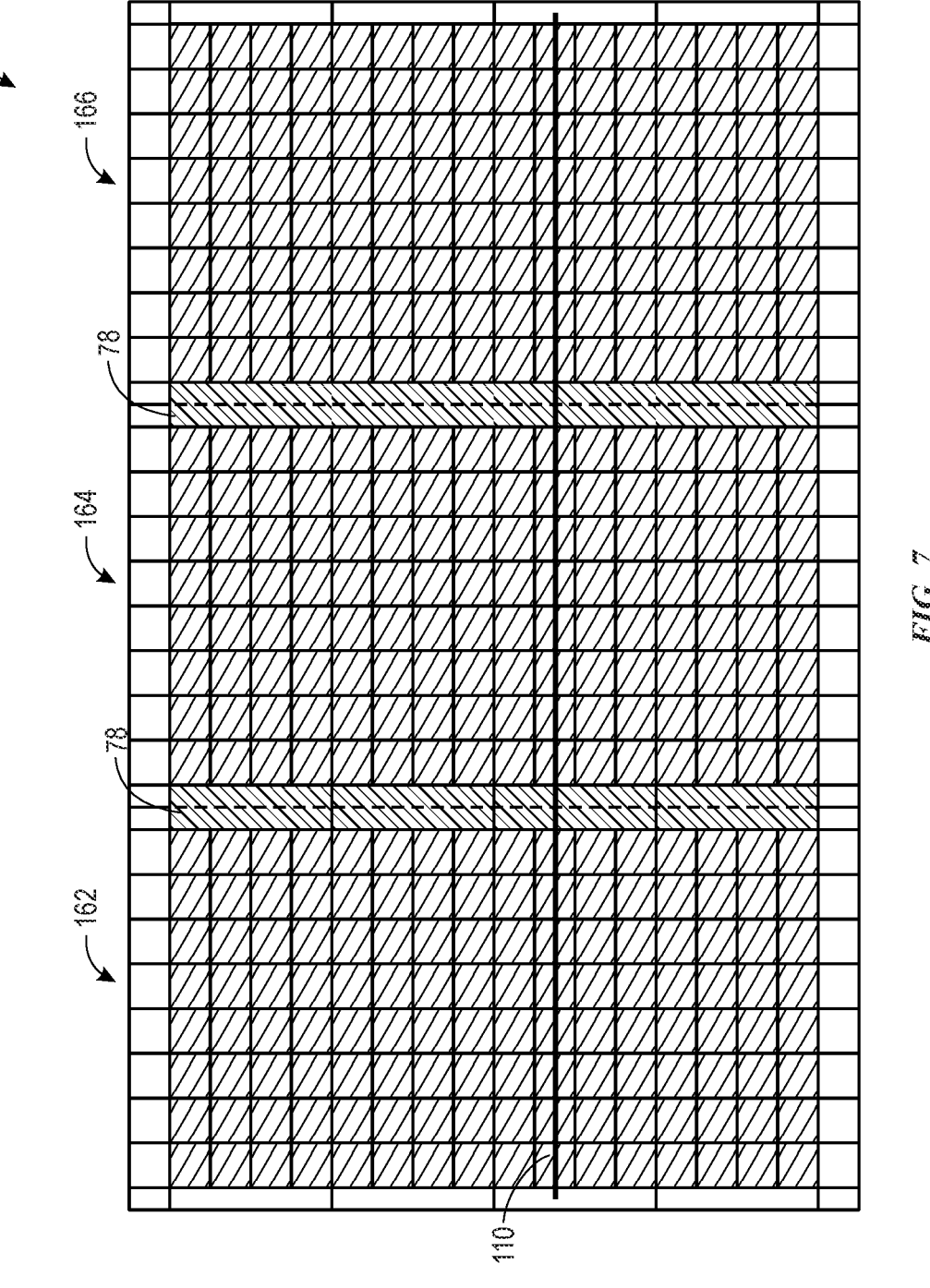
FIG. 7 is a top view of a block diagram of the reticle-stitched integrated circuit that is larger than the reticle limit, which includes three die areas each within the reticle limit, in accordance with an embodiment of the present disclosure.

In the example of FIG. 7, the reticle-stitched integrated circuit 12 may include three die areas 162, 164, and 166 that have been reticle-stitched in a horizontal configuration (e.g., the boundary area 78 crosses the x-axis) create a 3×1 reticle-stitched integrated circuit 12. In other examples, the reticle-stitched integrated circuit 12 may include three die areas that have been reticle-stitched in a vertical configuration (e.g., the boundary area crosses the y-axis) to create a 1×3 configuration.

The examples of FIGS. 6 and 7 are non-limiting examples for creating high-capacity integrated circuits, such as high-capacity FPGAs. That is, the configuration for reticle-stitching the set of patterns in the second layer or second set of layers may be done in any suitable number of ways. For example, the reticle-stitched integrated circuit 12 may include a 3×2 arrangement, a 4×1 arrangement, a 5×3 arrangement, etc. Moreover, there may be other geometries, such as an L-shaped arrangement in which a 1×3 arrangement is reticle-stitched to a 2×1 arrangement.

Figure 8:
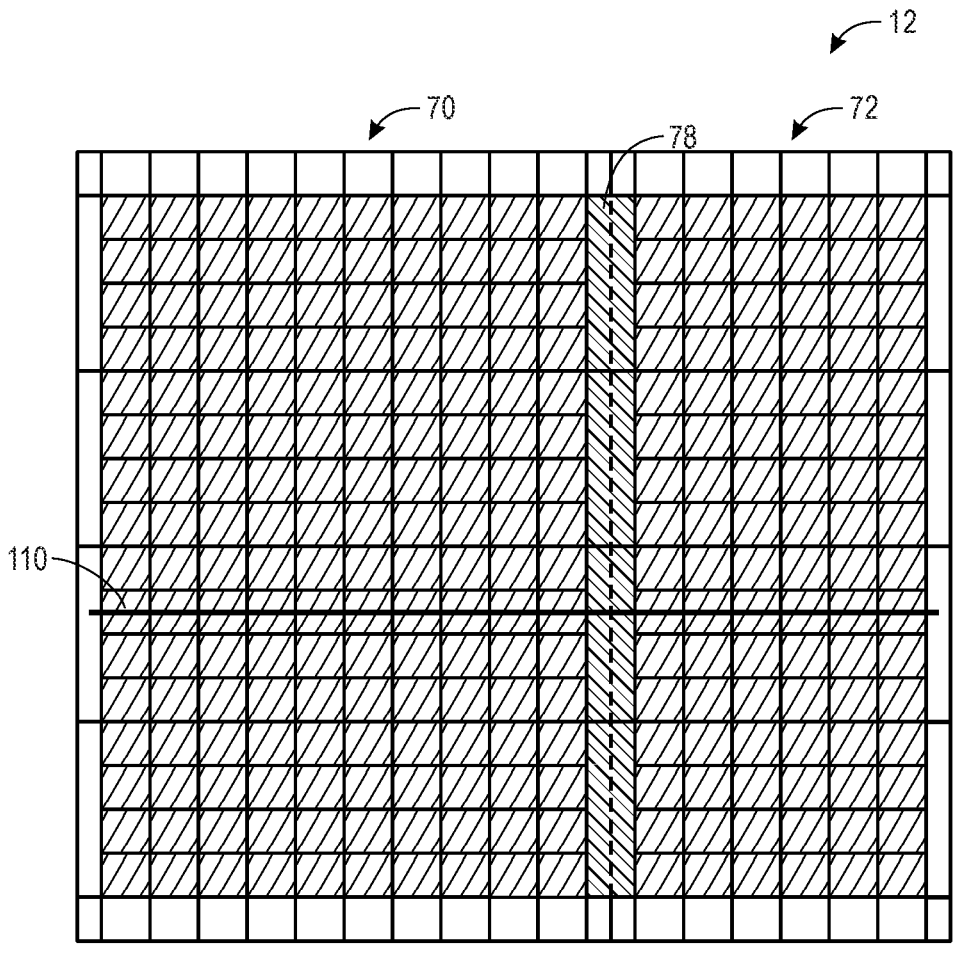
FIG. 8 is a top view of a block diagram of the reticle-stitched integrated circuit that is larger than the reticle limit, which includes two die areas each within the reticle limit, in accordance with an embodiment of the present disclosure.

In another example, as shown in FIG. 8, the reticle-stitched integrated circuit 12 may include a first die area 70 and a second die area 72 with different sizes. For example, the first die area 70 may be patterned to be less than the reticle limit 76 (e.g., 25.001 mm×33 mm) and the second die area 72 may be patterned to be smaller than the first die area 70 (e.g., 10.001 mm×33 mm). The first die area 70 and the second die area 72 may overlap at the boundary area 78 (e.g., 0.0005 mm, 0.001 mm, 0.002 mm) such that the combination of the first die area 70 and the second die area 72 collectively exceed the reticle limit 76.

Figure 9:
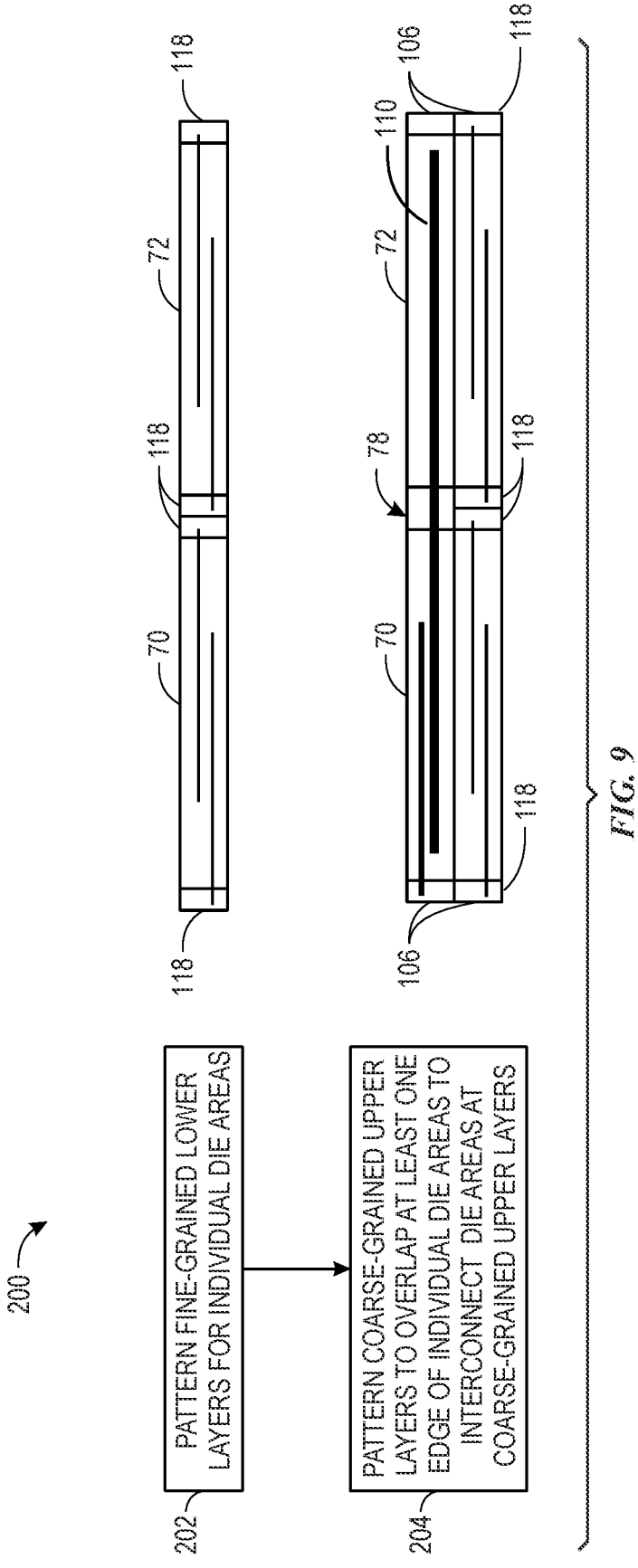
FIG. 9 is flowchart of a method for manufacturing the reticle-stitched integrated circuit, in accordance with an embodiment.

With the foregoing in mind, FIG. 9 is an example method 200 illustrating a manner of manufacturing the high-capacity integrated circuit 12. Using any suitable lithography system (e.g., a 7 nm lithography system, a 5 nm lithography system, a 3 nm lithography system), a first layer or first set of layers may be patterned with a first set of masks that are uniform for the various die areas with a die size equal to or less than the reticle limit (block 202). For example, the first layer or first set of layers may include a set of layers below a threshold layer and/or include the threshold layer and may have a fine-grained architecture. The fine-grained lower layers may be patterned with a first set of patterns of uniform die areas, which are adjacent to each other and may not overlap. The communication wires of the first layer or first set of layers may be located wholly within the first die area 70 and the second die area 72, respectively, and may not overlap. That is, the communication wires of the first layer or first set of layers may not extend across the first die area 70 to the second die area 72. As such, the first die area 70 and the second die area 72 may include some fine-grained interconnect components 118 that are unused at the boundary area 78.

A second layer or second set of layers may be patterned with a second set of masks that are different for the different die areas 70 and 72 (block 202). Here, though, the second layer or second set of layers include a second number of patterns that have at least some overlap in the first die area 70 and the second die area 72 (block 204). The second layer or second set of layers may be above some threshold layer and/or include the threshold layer and may have a coarser-grained architecture than the first layer or first set of layers. The coarser-grain architecture of the second layer or second set of layers may allow small misalignments during the patterning process, while still allowing communication wires to overlap in the boundary area 78 to form communication wires 110 that cross the boundary area 78. In some embodiments, a first mask of a second set masks used to pattern the second layer or the second set of layers may be used to pattern multiple wafers at once before alternating to a second mask of the second set of masks. In another example, the second set of masks may be used to pattern one wafer at a time. In some embodiments, the reticle-stitched integrated circuit 12 may be patterned by alternating different masks of the second set of masks for different die areas 70, 72 so that they collectively overlap in the boundary area 78. Moreover, as shown in FIGS. 6-8, by selecting the arrangement of the second set of masks for the second layer or second set of layers (e.g., the upper layers), different configurations (e.g., 3×1, 4×2, 5×3) may be used to create unique high-capacity integrated circuits (e.g., since the lower layers may be uniform in each die area but the upper layers may overlap at the boundary areas 78 to connect the different die areas of a reticle-stitched integrated circuit 12). The designer may create different patterns for second layers depending the desired signal transfer of the reticle-stitched integrated circuit 12.

After patterning, the wafer may be diced along the edges of the reticle-stitched integrated circuit 12. Because some communication wires (e.g., the communication wire 100) may connect directly from the first die area 70 to the second die area 72, the reticle-stitched integrated circuit 12 may overcome the reticle limit and may have properties similar to a monolithic die. That is, the reticle-stitched integrated circuit 12 may have improved bandwidth, signal transfer, performance, and the like compared to an integrated circuit transferring a signal through an interposer. In this way, high-capacity integrated circuits 10 with sizes great than the reticle limit can be obtained.

Figure 10:
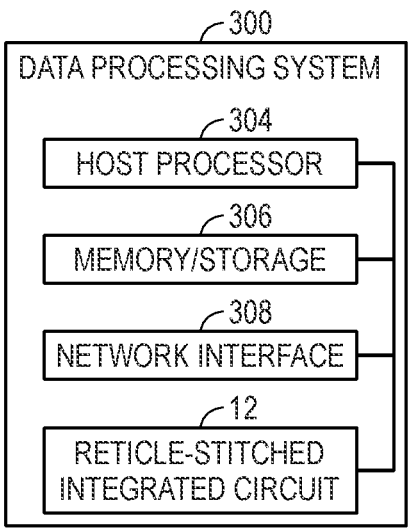
FIG. 10 is a block diagram of a data processing system including a reticle-stitched integrated circuit, in accordance with an embodiment.

Bearing the foregoing in mind, the reticle-stitched integrated circuit 12 may be a component included in a data processing system, such as a data processing system 300, shown in FIG. 10. The data processing system 300 may include the reticle-stitched integrated circuit 12 (e.g., a reticle-stitched programmable logic device), a host processor 304 (e.g., a reticle-stitched processor), memory and/or storage circuitry 306, and a network interface 308. The data processing system 300 may include more or fewer components (e.g., electronic display, user interface structures, application specific integrated circuits (ASICs)). Moreover, any of the circuit components depicted in FIG. 10 may include reticle-stitched integrated circuits. The host processor 304 may include any of the foregoing processors that may manage a data processing request for the data processing system 300 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 306 may include random access memory (RAM), read-only memory (ROM), one or more hard drives, flash memory, or the like. The memory and/or storage circuitry 306 may hold data to be processed by the data processing system 300. In some cases, the memory and/or storage circuitry 306 may also store configuration programs (bitstreams) for programming the reticle stitched integrated circuit 12. The network interface 308 may allow the data processing system 300 to communicate with other electronic devices. The data processing system 300 may include several different packages or may be contained within a single package on a single package substrate. For example, components of the data processing system 300 may be located on several different packages at one location (e.g., a data center) or multiple locations. For instance, components of the data processing system 300 may be located in separate geographic locations or areas, such as cities, states, or countries.

In one example, the data processing system 300 may be part of a data center that processes a variety of different requests. For instance, the data processing system 300 may receive a data processing request via the network interface 308 to perform encryption, decryption, machine learning, video processing, voice recognition, image recognition, data compression, database search ranking, bioinformatics, network security pattern identification, spatial navigation, digital signal processing, or some other specialized task.

The above discussion has been provided by way of example. Indeed, the embodiments of this disclosure may be susceptible to a variety of modifications and alternative forms. Indeed, many other suitable forms of high-capacity integrated circuits can be manufactured according to the techniques outlined above. For example, other high-capacity integrated circuit devices may include more than two dies that have been reticle stitched to for a reticle-stitched die. Some reticle-stitched integrated circuits may have fewer or no chip-to-chip interconnects. Indeed, any number of integrated circuit devices may be developed that use a reticle-stitched die formed by two or more dies using these techniques.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENT

Example Embodiment 1

A reticle-stitched integrated circuit device extending over a first die area within a reticle limit of a first area of an integrated circuit wafer from which the integrated circuit device is patterned and a second die area within a reticle limit of a second area of the integrated circuit wafer, the integrated circuit device comprising:
  a first layer comprising communication wires in the first die area and the second die area, wherein all communication wires of the first layer that are located in the first die area are exclusively within the first die area and all communication wires of the first layer that are located in the second die area are exclusively within the second die area; and
  a second layer comprising communication wires in the first die area and the second die area, wherein at least some communication wires of the second layer that are located in the first die area overlap with at least some communication wires of the second layer that are located in the second die area.

Example Embodiment 2

The integrated circuit device of example embodiment 1, wherein the communication wires of the first layer are shorter than the communication wires of the second layer.

Example Embodiment 3

The integrated circuit device of example embodiment 1, comprising a first plurality of layers that includes the first layer, wherein the first plurality of layers comprise communication wires in the first die area and the second die area, wherein all communication wires of the first plurality of layers that are located in the first die area are exclusively within the first die area and all communication wires of the first plurality of layers that are located in the second die area are exclusively within the second die area.

Example Embodiment 4

The integrated circuit device of example embodiment 3, wherein the first plurality of layers is disposed beneath the second layer.

Example Embodiment 5

The integrated circuit device of example embodiment 1, comprising a second plurality of layers that includes the second layer, wherein the second plurality of layers comprise communication wires in the first die area and the second die area, wherein at least some communication wires of the second plurality of layers that are located in the first die area overlap with at least some communication wires of the second plurality layers that are located in the second die area.

Example Embodiment 6

The integrated circuit device of example embodiment 1, wherein the communication wires of the first layer have a uniform pattern in the first die area and in the second die area.

Example Embodiment 7

The integrated circuit device of example embodiment 1, wherein a first pattern of the communication wires of the first die area in the second layer is different from a second pattern of the communication wires of the second die area in the second layer.

Example Embodiment 8

The integrated circuit device of example embodiment 1, wherein:

the first layer comprises communication wires in a third die area located within a reticle limit of a third area of the integrated circuit wafer from which the integrated circuit device is patterned, wherein all communication wires of the first layer that are located in the third die area are exclusively within the third die area; and the second layer comprises communication wires in the third die area, wherein at least some communication wires of the second layer that are located in the third die area overlap with at least some communication wires of the second layer that are located in the second die area or at least some communication wires of the second layer that are located in the first die area.

Example Embodiment 9

The integrated circuit device of example embodiment 8, wherein the third die area is adjacent to the first die area.

Example Embodiment 10

The integrated circuit device of example embodiment 8, wherein the third die area is adjacent to the second die area but not the first die area.

Example Embodiment 11

The integrated circuit device of example embodiment 8, wherein at least some of the communication wires of the second layer that are located in the third die area overlap with at least some of the communication wires of the second layer that are located in the second die area and at least some communication wires of the second layer that are located in the first die area.

Example Embodiment 12

An integrated circuit device comprising:
a first die area disposed within a first reticle limit of a first area of an integrated circuit wafer from which the integrated circuit device is formed; and a second die area disposed within a second reticle limit of a second area of the integrated circuit wafer from which the integrated circuit device is formed;

wherein:
the first die area and the second die area comprise a first plurality of layers having a respective first plurality of patterns, wherein the first plurality of patterns remain entirely within the first die area and within the second die area; and the first die area and the second die area comprise a second plurality of layers having a respective second plurality of patterns, wherein at least some of the second plurality of patterns overlap in a boundary area between the first die area and within the second die area.

Example Embodiment 13

The integrated circuit device of example embodiment 12, wherein the first die area and the second die area of the first plurality of layers are adjacent and at least some of the second plurality of patterns overlap between one edge of the first die area and one edge of the second die area.

Example Embodiment 14

The integrated circuit device of example embodiment 12, wherein the first plurality of layers are below a threshold layer and the second plurality of layers are above the threshold layer.

Example Embodiment 15

The integrated circuit device of example embodiment 12, wherein the second plurality of patterns comprise a size of the first die area that is different from a size of the second die area.

Example Embodiment 16

The integrated circuit device of example embodiment 12, wherein at least one edge of the first die area and the second die area comprise at least one interconnection resource for signal transfer or off-die communication.

Example Embodiment 17

The integrated circuit device of example embodiment 16, wherein the second plurality of layers comprise communication wires connecting from interconnect resources along an edge of the first die area to interconnect resources along an edge of the second die area.

Example Embodiment 18

The integrated circuit device of example embodiment 12, wherein the first plurality of patterns layers comprise a first pattern comprising at least one sacrificial edge in the first die area that includes unused components of die-to-die interconnect resources.

Example Embodiment 19

The integrated circuit device of example embodiment 18, wherein the sacrificial edge is adjacent to a second sacrificial edge in the second die area at a boundary area.

Example Embodiment 20

A method of manufacturing an integrated circuit device, comprising:
    patterning a first layer of an integrated circuit wafer with a first plurality of patterns, wherein the first plurality of patterns comprise a first die area and a second die area, and wherein the first die area and the second die have no overlap; and
    patterning a second layer of the integrated circuit wafer with a second plurality of patterns, wherein at least some of the second plurality of patterns overlap between the first die area and the second die area.

Example Embodiment 21

The method of manufacturing of example embodiment 20, comprising dicing the integrated circuit wafer to create a reticle-stitched integrated circuit, wherein a size of the reticle-stitched integrated circuit is greater than a reticle limit.

Example Embodiment 22

The method of manufacturing of example embodiment 20, comprising connecting communication wires from an edge of the first die area of the second layer to an edge of the second die area of the second layer, wherein at least some communication wires connect in the overlap between the first die area and the second die area.

Example Embodiment 23

The method of manufacturing of example embodiment 20, wherein patterning the second layer of the integrated circuit wafer with the second plurality of patterns comprises:
    patterning the first die area with a first pattern;
    patterning the second die area with a second pattern, wherein at least some of the second pattern overlaps the second die area and the first die area; and
    alternating the patterning of the first pattern and the second pattern.

Example Embodiment 24

The method of manufacturing of example embodiment 23, wherein the second pattern of the second plurality of patterns comprises at least one communication wire disposed over a sacrificial area on at least one edge of the second die area.

Example Embodiment 25

The method of manufacturing of example embodiment 20, wherein patterning the second layer of the integrated circuit wafer with the second plurality of patterns comprises:
    patterning the first die area with a first pattern at least two or more times; and
    patterning the second die area with a second pattern at least two or more times, wherein at least some of the second pattern overlap between the first die area and the second die area.

What is claimed is:

1. A reticle-stitched integrated circuit device extending over a first die area within a reticle limit of a first area of an integrated circuit wafer from which the integrated circuit device is patterned and a second die area within a reticle limit of a second area of the integrated circuit wafer, the integrated circuit device comprising:
    a first layer comprising communication wires in the first die area and the second die area, wherein all communication wires of the first layer that are located in the first die area are exclusively within the first die area and all communication wires of the first layer that are located in the second die area are exclusively within the second die area; and
    a second layer comprising communication wires in the first die area and the second die area, wherein at least some communication wires of the second layer that are located in the first die area overlap with at least some communication wires of the second layer that are located in the second die area.

2. The integrated circuit device of claim 1, wherein the communication wires of the first layer are shorter than the communication wires of the second layer.

3. The integrated circuit device of claim 1, comprising a first plurality of layers that includes the first layer, wherein the first plurality of layers comprise communication wires in the first die area and the second die area, wherein all communication wires of the first plurality of layers that are located in the first die area are exclusively within the first die area and all communication wires of the first plurality of layers that are located in the second die area are exclusively within the second die area.

4. The integrated circuit device of claim 3, wherein the first plurality of layers is disposed beneath the second layer.

5. The integrated circuit device of claim 1, comprising a second plurality of layers that includes the second layer, wherein the second plurality of layers comprise communication wires in the first die area and the second die area, wherein at least some communication wires of the second plurality of layers that are located in the first die area overlap with at least some communication wires of the second plurality layers that are located in the second die area.

6. The integrated circuit device of claim 1, wherein the communication wires of the first layer have a uniform pattern in the first die area and in the second die area.

7. The integrated circuit device of claim 1, wherein a first pattern of the communication wires of the first die area in the second layer is different from a second pattern of the communication wires of the second die area in the second layer.

8. The integrated circuit device of claim 1, wherein:
    the first layer comprises communication wires in a third die area located within a reticle limit of a third area of the integrated circuit wafer from which the integrated circuit device is patterned, wherein all communication wires of the first layer that are located in the third die area are exclusively within the third die area; and
    the second layer comprises communication wires in the third die area, wherein at least some communication wires of the second layer that are located in the third die area overlap with at least some communication wires of the second layer that are located in the second die area or at least some communication wires of the second layer that are located in the first die area.

9. The integrated circuit device of claim 8, wherein the third die area is adjacent to the first die area.

10. The integrated circuit device of claim 8, wherein the third die area is adjacent to the second die area but not the first die area.

11. The integrated circuit device of claim 8, wherein at least some of the communication wires of the second layer that are located in the third die area overlap with at least some of the communication wires of the second layer that are located in the second die area and at least some communication wires of the second layer that are located in the first die area.

12. An integrated circuit device comprising:

a first die area disposed within a first reticle limit of a first area of an integrated circuit wafer from which the integrated circuit device is formed; and a second die area disposed within a second reticle limit of a second area of the integrated circuit wafer from which the integrated circuit device is formed;

wherein:

the first die area and the second die area comprise a first plurality of layers having a respective first plurality of patterns, wherein the first plurality of patterns remain entirely within the first die area and within the second die area; and the first die area and the second die area comprise a second plurality of layers having a respective second plurality of patterns, wherein at least some of the second plurality of patterns overlap in a boundary area between the first die area and within the second die area.

13. The integrated circuit device of claim 12, wherein the first die area and the second die area of the first plurality of layers are adjacent and at least some of the second plurality of patterns overlap between one edge of the first die area and one edge of the second die area.

14. The integrated circuit device of claim 12, wherein the first plurality of layers are below a threshold layer and the second plurality of layers are above the threshold layer.

15. The integrated circuit device of claim 12, wherein the second plurality of patterns comprise a size of the first die area that is different from a size of the second die area.

16. The integrated circuit device of claim 12, wherein at least one edge of the first die area and the second die area comprise at least one interconnection resource for signal transfer or off-die communication.

17. The integrated circuit device of claim 16, wherein the second plurality of layers comprise communication wires connecting from interconnect resources along an edge of the first die area to interconnect resources along an edge of the second die area.

18. The integrated circuit device of claim 12, wherein the first plurality of patterns comprise a first pattern comprising at least one sacrificial edge in the first die area that includes unused components of die-to-die interconnect resources.

19. The integrated circuit device of claim 18, wherein the sacrificial edge is adjacent to a second sacrificial edge in the second die area at a boundary area.

* * * * *